United States Patent [19]
Howell et al.

[11] 4,030,067
[45] June 14, 1977

[54] TABLE LOOKUP DIRECT DECODER FOR DOUBLE-ERROR CORRECTING (DEC) BCH CODES USING A PAIR OF SYNDROMES

[75] Inventors: Thomas H. Howell, Scottsdale; Gordon E. Gregg, Tempe; Leonard Rabins, Scottsdale, all of Ariz.

[73] Assignee: Honeywell Information Systems, Inc., Phoenix, Ariz.

[22] Filed: Dec. 29, 1975

[21] Appl. No.: 645,056

[52] U.S. Cl. ............... 340/146.1 AL; 235/153 AM
[51] Int. Cl.² ........................................ G06F 11/12
[58] Field of Search .................. 340/146.1 AL; 235/153 AM

[56] References Cited
UNITED STATES PATENTS

| | | | |
|---|---|---|---|
| 3,685,014 | 8/1972 | My-Yue Hsiao et al. | 340/146.1 AL |
| 3,697,948 | 10/1972 | Bossen | 340/146.1 AL |
| 3,714,629 | 1/1973 | Hong et al. | 340/146.1 AL |
| 3,755,779 | 8/1973 | Price | 340/146.1 AL |
| 3,958,220 | 5/1976 | Marshall | 340/146.1 AL |

*Primary Examiner*—Charles E. Atkinson
*Attorney, Agent, or Firm*—William W. Holloway, Jr.; Ronald T. Reiling; Nicholas Prasinos

[57] ABSTRACT

Apparatus for directly decoding and correcting double-bit random errors per word and for detecting triple-bit errors per word is disclosed. Said apparatus comprises a syndrome calculator which operates upon codewords received from memory and generates syndromes. The syndromes are operated upon and translated by a mapping device which generates pointers identifying the bits which are in error. The pointers are then passed through decoding means to generate error words which are summed with the received word from memory to provide a corrected codeword. The syndrome calculator may further provide a parity check signal to determine if a three-bit error is present, in which case the decoding means are not enabled and a signal is generated indicating that a triple-bit error has been detected which is not correctable.

10 Claims, 8 Drawing Figures

FIG-1a

FIG-1b $$H = \begin{bmatrix} 0 & 1 & 0 & 0 & 0 & 1 & 0 & 0 & 1 & 1 & 0 & 1 & 0 & 1 & 1 & 1 \\ 0 & 0 & 1 & 0 & 0 & 1 & 1 & 0 & 1 & 0 & 1 & 1 & 1 & 1 & 0 & 0 \\ 0 & 0 & 0 & 1 & 0 & 0 & 1 & 1 & 0 & 1 & 0 & 1 & 1 & 1 & 1 & 0 \\ 0 & 0 & 0 & 0 & 1 & 0 & 0 & 1 & 1 & 0 & 1 & 0 & 1 & 1 & 1 & 1 \\ 0 & 1 & 0 & 0 & 0 & 1 & 1 & 0 & 0 & 0 & 1 & 1 & 0 & 0 & 0 & 1 \\ 0 & 0 & 0 & 0 & 1 & 1 & 0 & 0 & 0 & 1 & 1 & 0 & 0 & 0 & 1 & 1 \\ 0 & 0 & 0 & 1 & 0 & 1 & 0 & 0 & 1 & 0 & 1 & 0 & 0 & 1 & 0 & 1 \\ 0 & 0 & 1 & 1 & 1 & 0 & 1 & 1 & 1 & 0 & 1 & 1 & 1 & 0 & 1 & 1 \\ 1 & 1 & 1 & 1 & 1 & 1 & 1 & 1 & 1 & 1 & 1 & 1 & 1 & 1 & 1 & 1 \end{bmatrix}$$

| ADDRESS | CONTENTS |
|---------|----------|
| 0000 | XXXX |
| 0001 | 0001 |
| 0010 | 1111 |
| 0011 | 1000 |
| 0100 | 1010 |
| 0101 | 1100 |
| 0110 | 0001 |
| 0111 | 0001 |
| 1000 | 1100 |
| 1001 | 1000 |
| 1010 | 1000 |
| 1011 | 1010 |
| 1100 | 1010 |
| 1101 | 1100 |
| 1110 | 1111 |
| 1111 | 1111 |

Fig. 4

| ADDRESS | | | | CONTENTS | | | | | |
|---|---|---|---|---|---|---|---|---|---|
| 0 | 0 | 0 | 0 | 0 | 0 | 0 | 0 | 1 |
| 0 | 0 | 0 | 1 | 1 | 0 | 1 | 1 | 1 |
| 0 | 0 | 1 | 0 | 1 | 1 | 0 | 1 | 1 |
| 0 | 0 | 1 | 1 | 1 | 1 | 1 | 0 | 1 |
| 0 | 1 | 0 | 0 | 1 | 1 | 0 | 0 | 1 |
| 0 | 1 | 0 | 1 | 1 | 1 | 1 | 1 | 1 |
| 0 | 1 | 1 | 0 | 1 | 0 | 0 | 1 | 1 |
| 0 | 1 | 1 | 1 | 1 | 0 | 1 | 0 | 1 |

TABLE LOOKUP DIRECT DECODER FOR DOUBLE-ERROR CORRECTING (DEC) BCH CODES USING A PAIR OF SYNDROMES

RELATED APPLICATIONS

U.S. application Ser. No. 644,776 entitled "Matrix Multiplier in GF ($2^m$)" invented by the same inventors and assigned to the same assignee named herein and filed on the same date, is incorporated by reference to the instant application.

BACKGROUND OF THE INVENTION

1. Field of the Invention

This invention relates generally to memory systems for electronic data processing systems and, in particular, to error correction and detection means for said memory systems.

2. Description of the Prior Art

In recent years data processing systems have been evolving towards more efficient and larger systems. Of critical importance to these data processing systems are their memory systems. Trends in the development of data processing systems have been paralleled, and significantly aided, by the development of very large memory systems.

Among requirements for memory systems is the need for extremely high accuracy. Since this requirement generally exceeds cost effective solutions for providing error-free components and organizations, memory systems are generally provided with error-detection and correction means (EDAC). (The detection capability of EDAC detects the presence of errors within its associated memory system, whereas the correction capability of EDAC corrects errors.) Prior art EDAC implementations generally provide for detection of one- or two-bit errors, but correction of only one-bit errors. This means that double-bit errors can be detected but not corrected and that multi-bit errors (an error occurring in more than two bits per word) may not be properly detected.

The effectiveness of prior art EDAC is inversely proportional to the number of errors occurring in a word. When there are no errors in a word, there are no problems as no errors need be detected nor corrected. Hence, an error free word is transmitted from the memory system. When there is one error per word, it is both detected and corrected, again allowing for an error free word to be transmitted from the memory system. Two errors in a word are detected but not corrected. The result is the generation of an error signal which requires other forms for correction, such as software intervention or a possible system shutdown. These latter forms of correction are extremely costly and, therefore, it is highly desirable to minimize their occurrence.

The difficulty in extending EDAC capabilities to double-error correction and triple-error detection (and beyond) or random errors lies in providing effective decoding apparatus for this function. More specifically, simple and fast encoding schemes are known within the prior art for providing extended EDAC functionality. Such encoding schemes are used with Goppa codes and Bose-Chaudhuri-Hocquenghem (BCH) codes and are similar to encoding schemes used with Hamming or modified Hamming codes. Such codes are discussed in detail in the following references: *Algebraic Coding Theory* by E. R. Berlekamp, McGraw-Hill, New York, New York 1968 and *Error-correcting Codes* by W. W. Peterson and E. J. Weldon, Second Edition MIT Press, Cambridge, Massachusetts 1972. Encoders for implementing these coding schemes may generally be provided. However, decoding apparatus has been complex, slow and inefficient. More specifically, prior art decoding means have generally been implemented with sequential-search decoding algorithms. There have not been implementations using direct decoding.

OBJECTS OF THE INVENTION

It is an object of the present invention, therefore, to provide apparatus for double-error correction (DEC) and triple-error detection (TED) for use with data processing memory systems.

It is another object of the present invention to provide efficient decoding means for double-error correcting codes.

It is still another object of the present invention to provide apparatus for double-error correction which utilizes a table of stored values for isolating detected errors.

It is yet another objective of the present invention to provide apparatus which implements an improved algorithm for directly decoding double-errors in memory words.

Other objects and benefits will become apparent from the following description of the preferred embodiment of the invention when read in conjunction with the drawings contained herewith.

SUMMARY OF THE INVENTION

The invention comprises apparatus for directly decoding and correcting double-bit random errors per word and for detecting triple-bit random errors per word. Said apparatus comprises a syndrome calculator which operates upon codewords received from memory and generates syndromes. The syndromes are operated upon by translation means which effectively provide an address of a table-entry location. Said table comprises a mapping device which generates pointers which identify the position of the bits which are in error. These pointers are passed through decoding means to generate two error words. Said error words contain all 0s except for 1 corresponding to the bit which is in error. The error words are summed with the received word from memory to provide a corrected word. The entire process requires one clock cycle.

The syndrome calculator further provides a parity check signal. Said parity check signal is used in combination with a signal from the table to generate a signal indicative of a three-bit error which is not correctable. When a three-bit error is present, the decoding means are disabled.

BRIEF DESCRIPTION OF TABLES

Table I shows a representation of $GF(2^4)$ for a maximum-exponent generator polynomial $g(x)=x^4+x+1$.

Table II shows an H matrix for an SEC cyclic code having the g(x) shown in Table I.

Table III shows an H matrix for encoding a DEC BCH code having $g(x)=m_1(x)m_3(x)$ where $m_1(x)=x^4+x+1$ and $m_3(x)=x^4+x^3+x^2+x+1$.

Table IV shows an H matrix for decoding a DEC BCH code having the g(x) shown in Table III.

Table V shows how the H matrices of Tables III and IV are extended to include a parity check bit for achieving TED capability.

DESCRIPTION OF THE PREFERRED EMBODIMENT

Theory of Operation

It is believed that a discussion of the basic principles of SEC and DEC cyclic codes will assist in understanding the operation of the present invention. For additional background and explanation of such codes, the reader is again directed to the references cited supra.

In most data processing systems, information is organized into words. EDAC works on each word sent to or from an associated memory system. Each word contains $k$ information bits. Encoding schemes add $m$ check bits to the $k$ information bits as they are sent to the memory, making the total length (natural length) of each codeword (when it is stored in and received from storage area of memory) equal to $n=k+m$.

A codeword C of length n may be represented as a polynomial $C(x)$ of degree $n-1$ with the first bit in the sequence being the most significant bit (MSB). The $k$ information bits of a codeword may be any combination of values. The $m$ check bits are appended to the $k$ information bits such that $C(x)$ will be a multiple of $g(x)$, $$C(x)=Q(x)g(x)$$

where $Q(x)$ is a polynomial with no terms of degree less than $x^0$ and $g(x)$ had degree $m$ (i.e., of degree equal to the number of check bits). All such $C(x)$ constitute a cyclic code, designated as an $(n,k)$ code. The polynomial $g(x)$ is called a generator polynomial with every codeword $C(x)$ a multiple of the generator polynomial.

The set of all $C(x)$ in a given cyclic code can be defined as the row space of a matrix $G(x)$, i.e., every linear combination of the rows of $G(x)$ is a $C(x)$. A generator matrix G may therefore be derived which defines or generates every possible codeword C.

An $m \times n$ matrix H is defined such that $$GH^T=[0].$$

i.e., the row space of H is the null space of G and vice versa. Since every row of G is orthogonal to every row of H, $$G_iH^T=\underline{0}$$

where $G_i$ is the ith row of G. Generalizing this property, any linear combination of the rows of G is orthogonal to H; therefore, $$CH^T=\underline{0}$$

for all codewords C.

Encoding and decoding implementations are based entirely on H and $g(x)$ with no direct reference to G. Therefore, a method of constructing H directly from $g(x)$ may be utilized. However, additional algebraic notation is needed.

The generator polynomial $g(x)$ defines a Galois field $GF(2^m)$. $GF(2^m)$ can be represented by the field of polynomials over $GF(2)$ modulo $g(x)$. Each field element is a residue class of polynomials such that any two polynomials in the same residue class are equivalent modulo $6(x)$. The residue class containing x is denoted z. Therefore, the field element z is a root of $g(x)$, i.e., $g(z)=0$. If $g(x)$ has been selected to be a maximum-exponent polynomial, then z is a primitive element, i.e., z has order $2^m-1$. Therefore, the powers of z, $z^0$ through $z^{n-1}$ where $n=2^m-1$, represent the n distinct non zero field elements in $GF(2^m)$. Table I shows a representation of $GF(2^4)$ for a maximum-exponent generator polynomial, $g(x)=x^4+x+1$.

Table I

| | | | | |
|---|---|---|---|---|
| $z^0 =$ | | | 1 | $= 0001$ |
| $z^1 =$ | | z | | $= 0010$ |
| $z^2 =$ | $z^2$ | | | $= 0100$ |
| $z^3 = z^3$ | | | | $= 1000$ |
| $z^4 =$ | | | $z+1$ | $= 0011$ |
| $z^5 =$ | | $z^2+z$ | | $= 0110$ |
| $z^6 = z^3+z^2$ | | | | $= 1100$ |
| $z^7 = z^3$ | | $+z+1$ | | $= 1011$ |
| $z^8 =$ | $z^2$ | $+1$ | | $= 0101$ |
| $z^9 = z^3$ | | $+z$ | | $= 1010$ |
| $z^{10} =$ | | $z^2+z+1$ | | $= 0111$ |
| $z^{11} = z^3+z^2+z$ | | | | $= 1110$ |
| $z^{12} = z^3+z^2+z+1$ | | | | $= 1111$ |
| $z^{13} = z^3+z^2$ | | $+1$ | | $= 1101$ |
| $z^{14} = z^3$ | | $+1$ | | $= 1001$ |
| $z^{15} =$ | | | 1 | $= z^0$ |

H can now be constructed as a function of $g(x)$. For SEC, H is composed of all powers of z in succession as its $n=2^m=1$ columns with the MSB at the bottom. Table II illustrates H for a single error correction (SEC) cyclic code having $g(x)$ used in deriving Table I. Since $m=4$, $n=2^m-1=15$ and $k=11$.

Table II

| H = | [ $z^0$ | $z^1$ | $z^2$ | $z^3$ | $z^4$ | $z^5$ | $z^6$ | $z^7$ | $z^8$ | $z^9$ | $z^{10}$ | $z^{11}$ | $z^{12}$ | $z^{13}$ | $z^{14}$ | ] |
|---|---|---|---|---|---|---|---|---|---|---|---|---|---|---|---|---|
| = | 1 | 0 | 0 | 0 | 1 | 0 | 0 | 1 | 1 | 0 | 1 | 0 | 1 | 1 | 1 | |
| | 0 | 1 | 0 | 0 | 1 | 1 | 0 | 1 | 0 | 1 | 1 | 1 | 1 | 0 | 0 | |
| | 0 | 0 | 1 | 0 | 0 | 1 | 1 | 0 | 1 | 0 | 1 | 1 | 1 | 1 | 0 | |
| | 0 | 0 | 0 | 1 | 0 | 0 | 1 | 1 | 0 | 1 | 0 | 1 | 1 | 1 | 1 | |

Therefore, $g(x)$ of degree 4 generates a (15,11) code, i.e., a code with a maximum of 11 information bits. The first $m$ columns of H, $z^0$ through $z^{m-1}$, correspond to the $m$ check bits and each column contains only one 1 and $m-1$ 0's. The remaining $k$ columns of H correspond to the k information bits. This characteristic can be seen in Table II and is true in general for any $g(x)$. Each row of H represents a parity equation defining even parity between one of the $m$ check bits and the selected (as indicated by 1 in the corresponding positions in the row) information bits. Accordingly H is called a parity check matrix. These relationships are used as the basis for encoding and decoding implementations.

Encoding is the process of adding m check bits to the k information bits to form a complete codeword C with the properties discussed above, specifically, $CH^T=0$. A combinational-logic encoder consists of m parity trees. Each of the m parity trees implements one of the m parity equations for generating one of the corresponding m check bits. The implementation is easily determined from an inspection of H. Each row of H identifies by 1's the information bits to be fed into a parity tree (i.e., a summer) to generate the check bit corresponding to that row. The m check bits are then appended to the $k$ information bits to provide the codeword C of length n which is stored in memory.

Upon accessing memory, it is necessary to decode the words stored in memory. Decoding is the process of producing the corrected codeword C from the received word R. The decoding process consists of two procedures: calculating a syndrome from which errors can be detected, and decoding the syndrome for use in error correction.

Syndrome S is a quantity which in the case of SEC can be calculated by use of parity trees similar to the parity trees used for encoding. In fact the hardware used for encoding can also be used for calculating S. (Additional hardware for including check bits in the calculations is required.) After S is calculated, it may be used to detect the position of the errors by the following method. The received word R can be represented as the sum of the original codeword C and an error word E, i.e., $R=C+E$. In general, S is the sum of those columns of H corresponding to the erroneous bits in R. If $E=0$, then no errors have occurred and $R=C$; S is therefore zero. For a single error in position $i$, $S=z^i$. In other words, when a single error has occurred, the syndrome S points to the erroneous bit by being equal to the column of H which is associated with the erroneous bit position. That bit can be corrected by decoding S from an $m$-bit quantity to 1-of-$n$ bit quantity (called the error word E) which has a 1 in the position of the error. The error word E is all 0's except for this 1. Thus, the original codeword C is produced.

Proceeding now to double-error correction (DEC), Bose-Chaudhuri-Hocquenghem (BCH) codes are a class of cyclic codes with multiple-error-correction capability. The present invention utilizes a BCH code; triple error detection (TED) capability is derived by extending the DEC BCH code with overall parity.

A DEC BCH code has generator polynomial $g(x)$ in the form $g(x)=m_1(x) m_3(x)$, where $m_1(x)$ and $m_3(x)$ are of degree $m$ and $m_1(x)$ is a maximum-exponent polynomial. z is a primitive element in the Galois field $GF(2^m)$ which denotes the residue class of $m_1(x)$ containing $x$, making z a root of $m_1(x)$. Furthermore, $m_1(x)$ is the minimum polynomial of z. Once $m_1(x)$ is selected, $m_3(x)$ is selected to be the minimum polynomial of $z^3$. Since $g(x)$ is of degree $2m$, codewords contains $2m$ check bits; the natural length of the codewords is $n=2^m-1$. The number of information bits k is $n-2m$. Similar to the definition of z with respect to $m_1(x)$, an element y is defined with respect to $g(x)$, i.e., y denotes the residue class of $g(x)$ containing $x$ and is therefore a root of $g(x)$.

The parity check matrix H can be represented in two equivalent forms as discussed infra. Encoding implementations are based on one form while decoding implementations are based on the other form. (Note that a form of H for both encoding and decoding for SEC is shown in Table II.) An encoding form of H for a natural length code consists of $n$ columns wich are the first $n$ powers of y. This form of H for $m_1(x)=x^4+x+1$, $m_3(x)=x^4+x^3+x^2+x+1$ is illustrated in Table III.

Table III $$H = [\; y^0 \; y^1 \; y^2 \; y^3 \; y^4 \; y^5 \; y^6 \; y^7 \; y^8 \; y^9 \; y^{10} \; y^{11} \; y^{12} \; y^{13} \; y^{14} \;]$$

$$=\begin{bmatrix}
1 & 0 & 0 & 0 & 0 & 0 & 0 & 0 & 1 & 1 & 0 & 1 & 0 & 0 & 0 \\
0 & 1 & 0 & 0 & 0 & 0 & 0 & 0 & 0 & 1 & 1 & 0 & 1 & 0 & 0 \\
0 & 0 & 1 & 0 & 0 & 0 & 0 & 0 & 0 & 0 & 1 & 1 & 0 & 1 & 0 \\
0 & 0 & 0 & 1 & 0 & 0 & 0 & 0 & 0 & 0 & 0 & 1 & 1 & 0 & 1 \\
0 & 0 & 0 & 0 & 1 & 0 & 0 & 0 & 1 & 1 & 0 & 1 & 1 & 1 & 0 \\
0 & 0 & 0 & 0 & 0 & 1 & 0 & 0 & 0 & 1 & 1 & 0 & 1 & 1 & 1 \\
0 & 0 & 0 & 0 & 0 & 0 & 1 & 0 & 1 & 1 & 1 & 0 & 0 & 1 & 1 \\
0 & 0 & 0 & 0 & 0 & 0 & 0 & 1 & 1 & 0 & 1 & 0 & 0 & 0 & 1
\end{bmatrix}$$

The decoding form of H consists of an upper half H1 and a lower half H3. The n columns of H1 are successive powers of z, i.e., $z^0$ through $z^{n-1}$. The columns H3 are successive powers of $z^3$, i.e., $z^0$, $z^3$, $z^6$... Each column of H3 is the cubed power of the column above it in H1. This form H with $m=4$ for $m_1(x)=x^4+x+1$, $m_3(x)=x^4+x^3+x^2+x+1$ is shown in Table IV.

Table IV $$H = \left\{\frac{H1}{H3}\right\} = \begin{bmatrix} z^0 & z^1 & z^2 & z^3 & z^4 & z^5 & z^6 & z^7 & z^8 & z^9 & z^{10} & z^{11} & z^{12} & z^{13} & z^{14} \\ z^0 & z^3 & z^6 & z^9 & z^{12} & z^0 & z^3 & z^6 & z^9 & z^{12} & z^0 & z^3 & z^6 & z^9 & z^{12} \end{bmatrix}$$

$$=\begin{bmatrix}
1 & 0 & 0 & 0 & 1 & 0 & 0 & 1 & 1 & 0 & 1 & 0 & 1 & 1 & 1 \\
0 & 1 & 0 & 0 & 1 & 1 & 0 & 1 & 0 & 1 & 1 & 1 & 1 & 0 & 0 \\
0 & 0 & 1 & 0 & 0 & 1 & 1 & 0 & 1 & 0 & 1 & 1 & 1 & 1 & 0 \\
0 & 0 & 0 & 1 & 0 & 0 & 1 & 1 & 0 & 1 & 0 & 1 & 1 & 1 & 1 \\
\hline
1 & 0 & 0 & 0 & 1 & 1 & 0 & 0 & 0 & 1 & 0 & 0 & 0 & 0 & 1 \\
0 & 0 & 0 & 1 & 1 & 0 & 0 & 0 & 1 & 1 & 0 & 0 & 0 & 1 & 1 \\
0 & 0 & 1 & 0 & 1 & 0 & 0 & 1 & 0 & 1 & 0 & 0 & 1 & 0 & 1 \\
0 & 1 & 1 & 1 & 1 & 0 & 1 & 1 & 1 & 1 & 1 & 1 & 1 & 1 & 1
\end{bmatrix}$$

Table IV-continued $$H = \left(\frac{H1}{H3}\right) = \begin{bmatrix} z^0 & z^1 & z^2 & z^3 & z^4 & z^5 & z^6 & z^7 & z^8 & z^9 & z^{10} & z^{11} & z^{12} & z^{13} & z^{14} \\ z^0 & z^3 & z^6 & z^9 & z^{12} & z^0 & z^3 & z^6 & z^9 & z^{12} & z^0 & z^3 & z^6 & z^9 & z^{12} \end{bmatrix}$$

Two syndromes, S1 and S3, must be calculated during a decoding process and are expressed as $$S1 = \Sigma z^i$$

$$S3 = \Sigma z^{3i}$$

where $0 \leq i \leq n-1$, $i$ designating all bit positions in error. In case of a double-bit error, the above equations yield $$S1 = z^i + z^j$$

$$S3 = z^{3i} + z^{3j}$$

where $i$ and $j$ designate the two erroneous bit positions and $i$ is less than $j$. These equations provide two linearly independent equations for two unknowns. Therefore $i$ and $j$ can be solved in terms of S1 and S3 (although not explicitly).

Decoding the syndromes to yield the two erroneous bit positions is the major task in a DEC BCH implementation. A new decoding algorithm is used in the implementation described below. Prior art implementations provide for a sequential search in solving for the unknowns. Although the result may be obtained in this manner, thee implementations are slow and cumbersome and not suitable for main memory applications. The present invention provides for a direct decode, i.e., decoding apparatus using combinational logic, which provides distinct advantages over the prior art.

The capability of TED is achieved by extending the DEC BCH code with simple, even parity over the entire BCH codeword. One parity bit is added to the codeword, increasing the total number of check bits to $2m+1$. The BCH codeword of length n is independent of parity and essentially is nested within a parity codeword of length $n+1$. Consequently, the BCH encoding and decoding processes ignore the parity bit; additional hardware is used to handle parity. Parity has the affect of altering H as shown in Table V.

Table V $$H = \begin{bmatrix} 0 & & & & \\ 0 & & & & \\ 0 & & & & \\ 0 & & & & \\ 0 & \text{Previously Shown H} & & \\ 0 & \text{(encoding or decoding)} & & \\ 0 & & & & \\ 0 & & & & \\ 0 & & & & \\ 1 & 1 & 1 & 1 & 1 & 1 & 1 & 1 & 1 & 1 & 1 & 1 & 1 & 1 & 1 & 1 \end{bmatrix}$$

The column of $2m$ zeroes added to the extreme left of H has no effect on the $2m$ parity equations represented by the rows of the above discussed forms of H. This characteristic shows that BCH processes are not altered by parity. The row of $n+1$ ones added to the bottom of H represents the parity equation over all $n+1$ bits of the parity codeword.

Operation of the Preferred Embodiment

The DEC EDAC implementation discussed below is preferably used in combination with a main memory system. Main memory is characterized by rapid, parallel data transfers, each transfer being one EDAC word wide. Main memory EDAC preferably has encoding and decoding implementations which use only combinational logic. The encoding and decoding processes are executed in a single clock cycle, i.e., directly, which is required by the data transfer rate.

The specific EDAC implementation discussed below is for a (16,7) code. a (16,7) code contains 7 information bits, 8 BCH check bits, and 1 parity check bit in each word. However, the principles of the present invention are general and can be utilized for $(n,k)$ codes or shortened $(n,k)$ codes where $n' < n$. In general, $n = 1 + 2m + k$, where $k$ equals the number of information bits and $m$ equals the smallest integer such that $n' \leq 2^m - 1$. For example, EDAC used in combination with main memory for Honeywell Series 6000 computers would use an (87,72) code. Each codeword would consists of two 36-bit machine words as 72 information bits, 14 check bits, and one parity bit.

A generator polynomial $g(x)$ for the (16,7) code is $$g(x) = m_1(x)m_3(x) = (x^4+x+1)(x^4+x^3+x^2+x+1) = x^8+x^7+x^6+x^4+1.$$

Figure 1A:
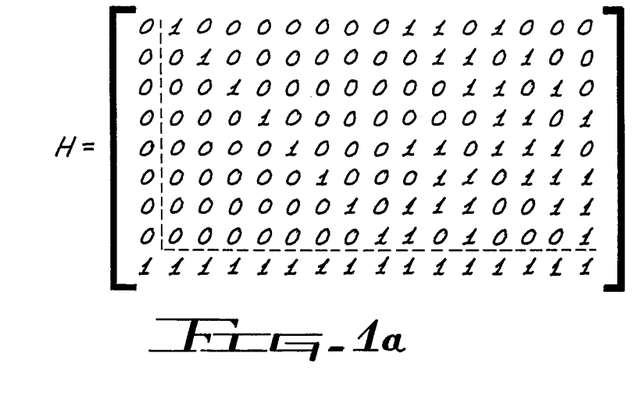
FIG. 1A shows an H matrix for encoding a DEC TED BCH code.
Figure 1B:
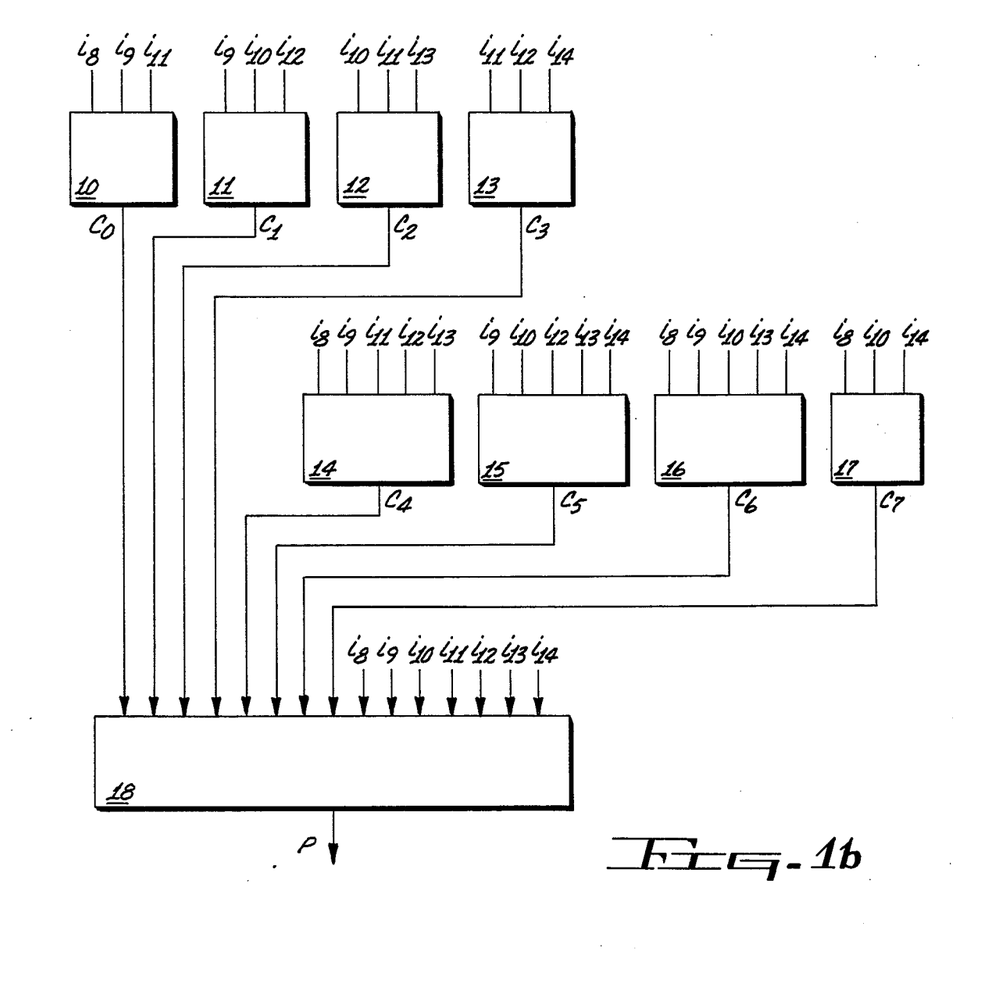
FIG. 1B is a block diagram of an encoder based on the H matrix of FIG. 1A.

The encoding form of the parity check matrix for this $g(x)$ is shown in FIG. 1A. In general, the encoding form of the parity check matrix will be a $(2m+1) \times (n)$ matrix. A parity-tree encoder based on this H is illustrated in FIG. 1B. This implementation is a direct encoder which accomplishes encoding in one clock cycle. Other implementations for the encoder will be obvious to those skilled in the art.

More specifically, the direct encoder of FIG. 1B is comprised of 9 parity-tree blocks 10 to 18. (In general, the encoder will have $2m+1$ parity-tree blocks.) The encoder receives 7 information bits $i_8$ to $i_{14}$ and generates a 16-bit codeword comprised of a parity bit $p$, 8 BCH check bits $c_0$ to $c_7$ and 7 information bits $i_8$ to $i_{14}$. Each of blocks 10 to 18 perform an XOR operation on its input signals to generate its output signal. Blocks 10 to 17 generate check bits $c_0$ to $c_7$ respectively by acting on the subset of informaion bits $i_8$ to $i_{14}$ indicated in FIG. 1B. These specific information bits are determined by the H matrix shown in FIG. 1A. For example, $c_0$ is the XOR (which is the same as the sum over GF(2)) of $i_8$, $i_9$, and $i_{11}$. This corresponds to the bit positions having a 1 in the first row of the H matrix of FIG. 1A. The other check bits have similar relationships determined by the respective rows of the encoding H matrix. The parity bit is generated by block 18 which performs an XOR operation on the check bits $c_0$ to $c_7$ and the information bits $i_8$ to $i_{14}$.

The direct decoder consists of two components: the syndrome calculator and the syndrome decoder, both constructed with combinational logic. The syndrome calculator is a parity tree device while the syndrome decoder implements and solves a direct-decoding error-locator equation discussed below.

The general form of S1 and S3 for the double error case is given by the equations $$S1 = z^i + z^j$$

$$S3 = z^{3i} + z^{3j}$$

where $z^i$ and $z^j$ identify erroneous bit positions. The equations may be combined and rewritten as the error-locator equation $$S3/S1^3 + 1 = B/S1 + (B/S1)^2$$

which has two roots represented by B: $z^i$ and $z^j$. The left side of the equation can be calculated from S1 and S3. Two values of B/S1 can be found, for example, via table lookup to satisfy the error-locator equation.

Figure 3:
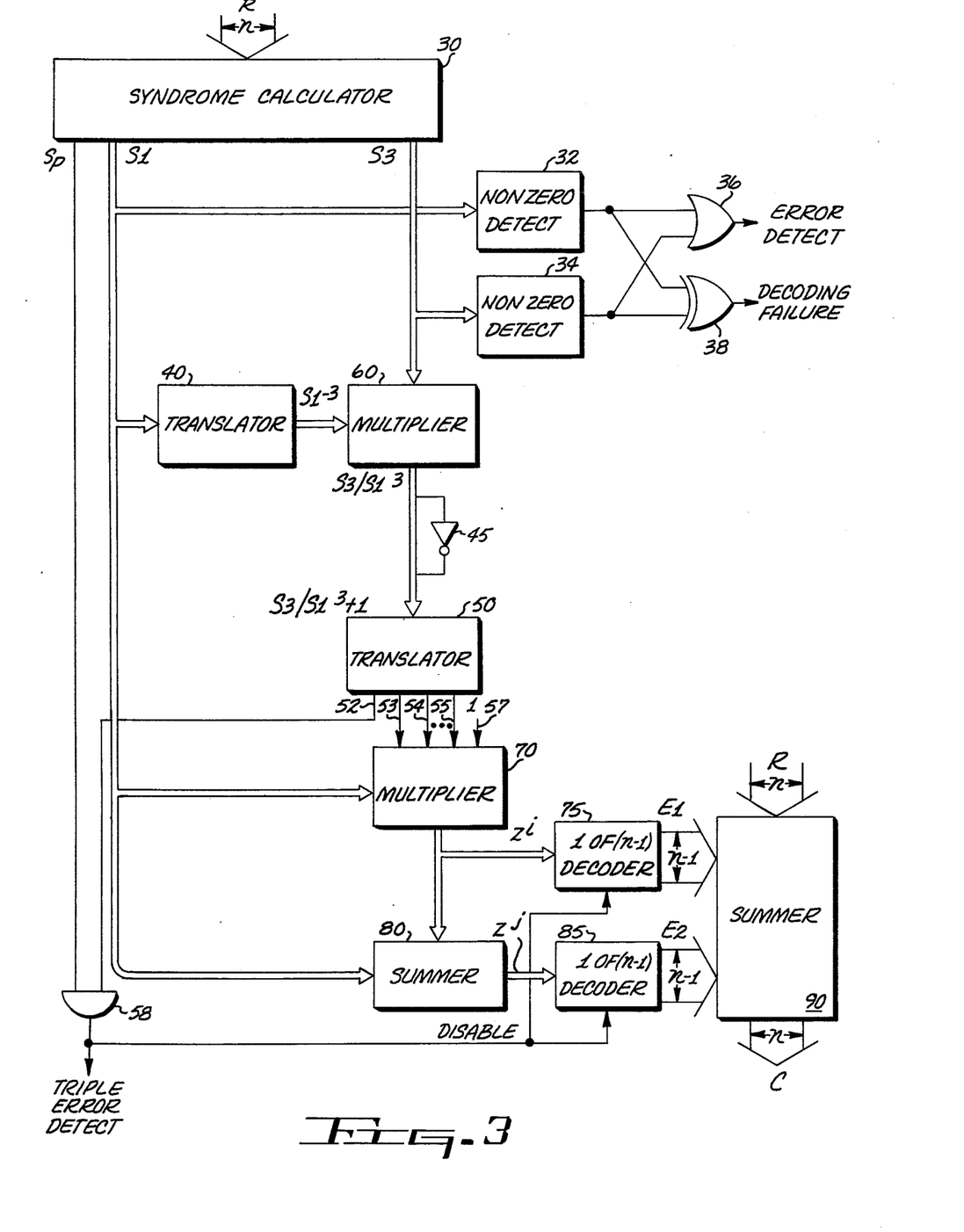
FIG. 3 is a block diagram of a direct decoder according to the present invention.

A direct decoder is shown in FIG. 3. This implementation is completely combinational and produces a corrected codeword in one clock cycle. Unless indicated otherwise, data paths in the Figures are $m$ bits wide. (In the case of the (16,17) code, $m=4$ and data paths are 4 bits wide.) The word R recceived from memory contains n bits gated in parallel to syndrome calculator 30.

Figure 2A:
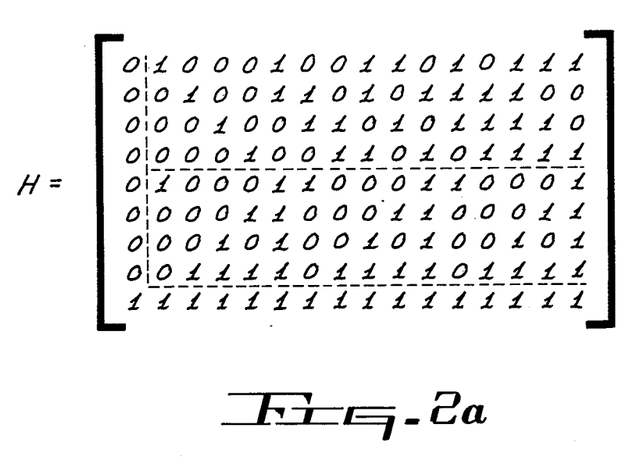
FIG. 2A shows an H matrix for decoding a DEC TED BCH code.
Figure 2B:
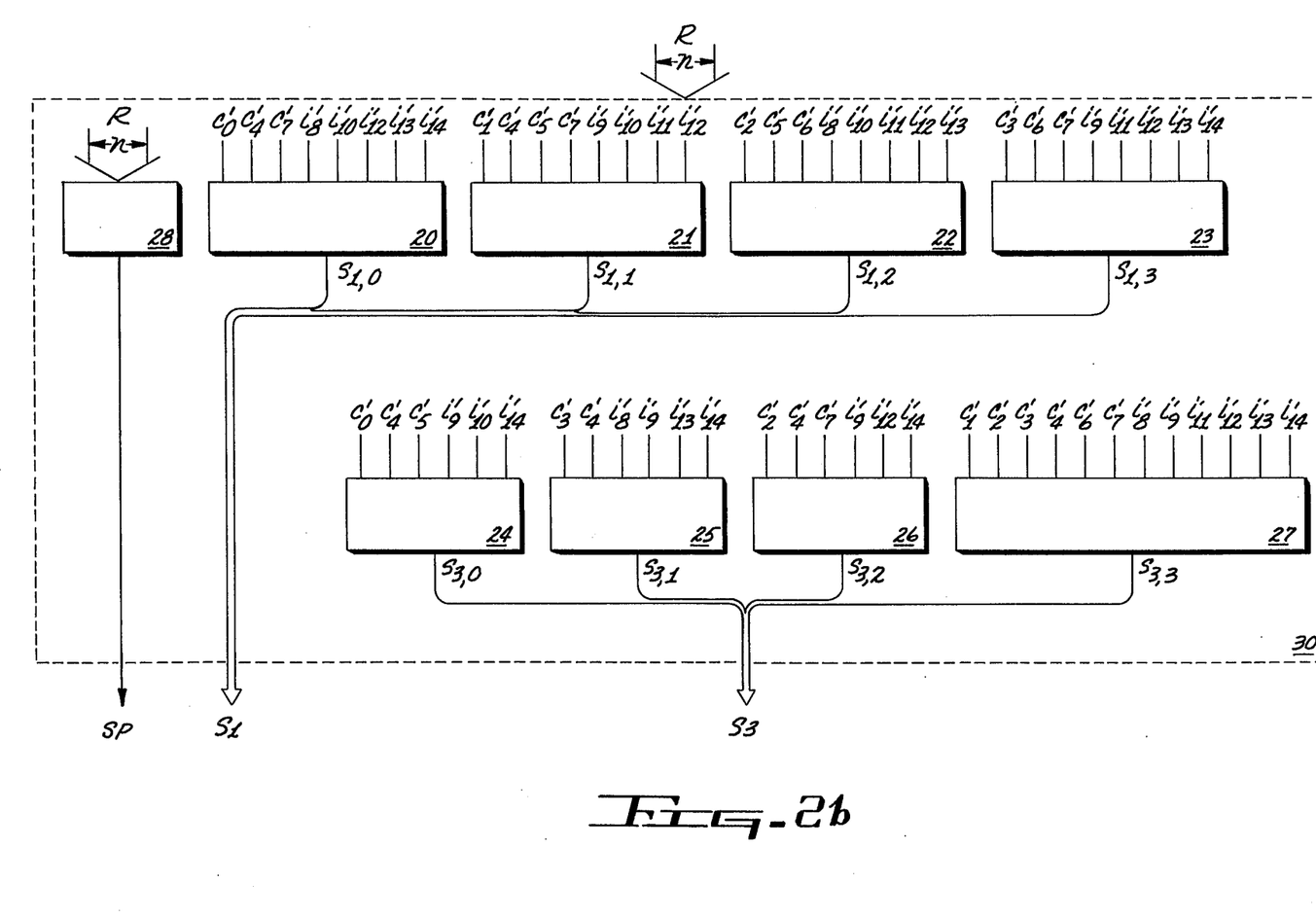
FIG. 2B is a block diagram of a syndrome calculator based on the H matrix of FIG. 2A and used in FIG. 3.

The decoding form of H for the (16,7) code is shown in FIG. 2A. FIG. 2B shows a syndrome calculator 30 which implements the H matrix of FIG. 2A. It is comprised of $2m+1$ blocks 20 to 28. Received word R is represented by 16 bits using the same notation as transmitted codeword C, with the exception of the prime symbols on the representation for R. The prime symbols indicate that due to potential errors, a bit of received word R may not be equal to the corresponding bit of transmitting codeword C. Each of blocks 21 to 28 performs an XOR operation or its input signals to generate its output signal. Blocks 20 to 23 generate signals $s_{1,0}$ to $s_{1,3}$ respectively, wherein $S1 = [s_{1,0}\ s_{1,1}\ s_{1,2}\ s_{1,3}]$. Blocks 24 to 27 generate signals $s_{3,0}$ to $s_{3,3}$ wherein $S3 = [s_{3,0}\ s_{3,1}\ s_{3,2}\ s_{3,3}]$. Block 28 generates parity check signal $s_p$ by performing an XOR function on all of the bits of received word R.

Referring now to FIG. 3, syndrome calculator 30 generates syndrome S1 and syndrome S3 which are fed into nonzero detect blocks 32 and 34 respectively. Syndromes equal to zero mean that there is no error. A nonzero value detected by either circuit implies that an error has been detected. Accordingly, OR gate 36 generates an Error-Detect signal.

Certain specific errors must be detected at this point because the rest of the decoder cannot handle them properly. These errors include three-or-more bit errors which cause one of the syndromes to be zero and the other nonzero. XOR gate 38 performs this function and generates a decoding failure signal. Other types of errors are beyond the correction capabilities of this decoder. A three-bit error resulting in both S1 and S3 being nonzero is distinguished from a one-bit error and identified by an appropriate signal in another part of the decoder (discussed below in conjunction with the parity check signal $s_p$). A four-bit error that results in both S1 and S3 being nonzero looks like a two-bit error and is miscorrected as such. A five-bit error is either miscorrected as if it were a one-bit error, goes undetected, or results in a decoding failure.

Figure 4:
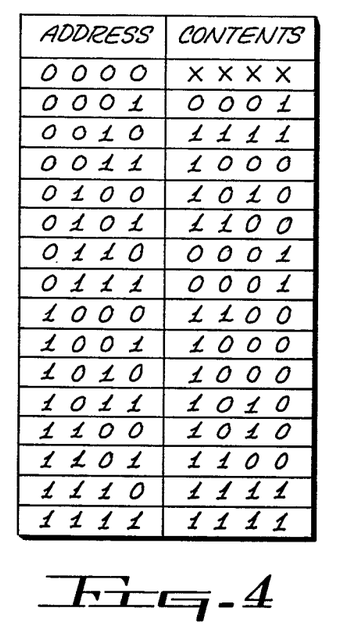
FIG. 4 shows a table of values used in the translators of FIG. 3 for translating S1 into $S1^{-3}$.

Syndrome S1 is also sent to translator 40. Translator 40 performs the function of translating S1 into $S1^{-3}$. In the embodiment for $m=4$, translator 40 comprises a table-lookup mechanism described in further detail in FIG. 4. FIG. 4 shows how the fifteen possible S1 values can be used as an address for a ROM. (The address 0000 is not used since it corresponds to no errors present.) The ROM contents are words which correspond to $S1^{-3}$. It is noted that all operations are modulo $m_1(x)$ and yields results which are elements of the Galois field $GF(2^4)$. It is further noted that $S1^{-3}$ is not unique for this case.

Returning to FIG. 3, block 60 corresponds to a multiplier which receives S3 from syndrome calculator 30 and $S1^{-3}$ from translator 40. These two quantities are multiplied in $GF(2^m)$ together to generate a word corresponding to $S3/S1^3$.

Figure 6:
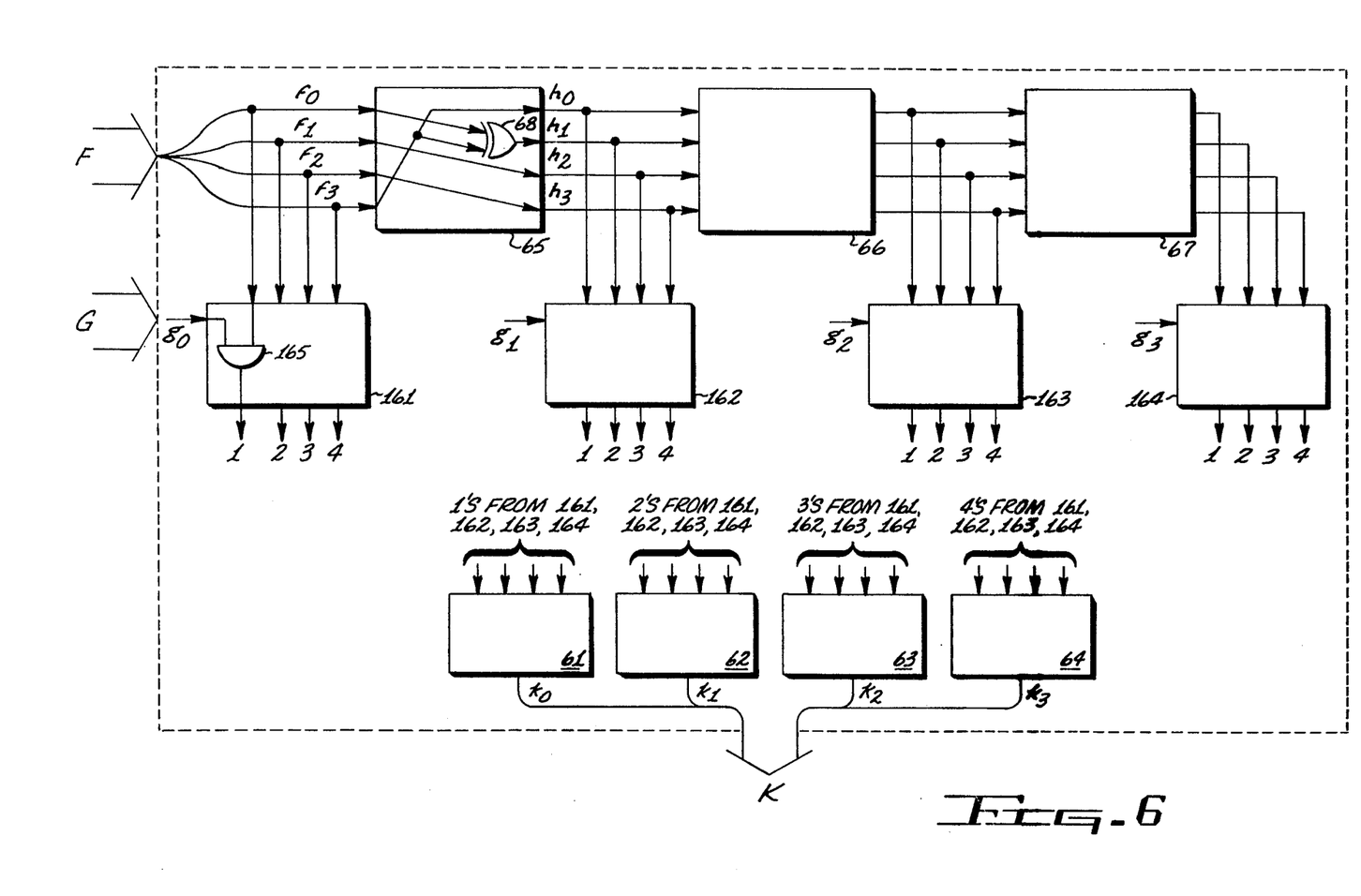
FIG. 6 is a block diagram of the multipliers used in FIG. 3.

FIG. 6 shows a multiplier for two elements in $GF(2^4)$. This is a special case of a muliplier which multiplies two arbitrary elements in $GF(2^m)$. For additional explanation of FIG. 6 or of the general case of $GF(2^m)$, refer to the related application which is cited supra and hereby incorporated by reference.

The multiplier in FIG. 6 receives as input signals two elements of $GF(2^4)$ which may be represented as 4-bit input signals F and G. The multiplicand F has bits $f_0, f_1, f_2, f_3$; $f_0$ being the LSB. The multiplier G has bits $g_0, g_1, g_2, g_3$; $g_0$ being the LSB. F and G may be considered polynomials $f(x)$ and $g(x)$. Blocks 65 to 67 are identical; they multiply their inputs by $x$ and produce a result modulo $m_1(x)$, which is necessarily also a 4-bit signal. As explained in the incorporated application for the general case, blocks 65 to 67 may be easily implemented by a simple switching and gating system. For example, the product $xf(x)$ may be represented as bits $h_0, h_1, h_2, h_3$; $h_0$ being the LAB. Block 65 switches signals as follows: $f_1$ to $h_2, f_2$ to $h_3$, and $f_3$ to $h_0, f_0$ and $f_3$ through XOR gate 68 to obtain $h_1$. The four bits of $f(x)$ are fed into block 161. Block 161 gates each of these signals by $g_0$. One of these gates 165 is shown in FIG. 6. Similarly, the 4 output signals from blocks 65, 66, 67 are sent to blocks 162, 163, 164 respectively and gated by signals $g_1, g_2, g_3$. The output signals from blocks 161 to 164 are labeled as 1, 2, 3, 4. This designation is merely for convenience. All 4 signals 1, the LSBs, are sent to block 61. Similarly, signals 2, 3, 4 are sent to blocks 62, 63, 64 respectively. Blocks 61 to 64 perform an XOR function on their input signals, thereby providing output signals $k_0$ to $k_3$ respectively, $k_0$ being the LSB. In this manner $FxG=K$.

Figure 5:
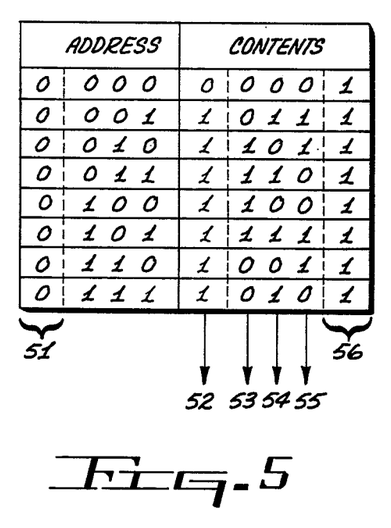
FIG. 5 shows a table of values used in the translator of FIG. 3 for finding B/S1.

Returning to FIG. 3, a 1 must be added to the quantity $S3/S1^3$ to obtain the left side of the error-locator equation. Adding a one is equivalent to inverting the least significant bit of a quantity (over GF (2)) which function is performed by inverter 45. This new quantity is now used to generate the quantity B/S1 of the error-locator equation. Translator 50 performs this function. Again, the preferred implementation translator 50 is a table lookup (e.g., via a ROM). The ROM for $m=4$ is described in conjunction with FIG. 5. The 4-bit input signal $S3/S1^3+1$ can be used as the address for ROM 50. The corresponding ROM location contains a B/S1 such that $B/S1+(B/S1)^2$ is equal to the address, as indicated by the error-locator equation. If the generator polynomial $m_1(x)$ is chosen properly, the most significant bit of the address quantity (shown as column 51)

is always zero. In this manner, the MSB can be eliminated from the address and only a three-bit input signal is required. A smaller ROM, with concomitant savings, can be utilized. The elimination of the MSB from the ROM address has other beneficial ramifications. Specifically, that portion of the muliplier 60 which calculates the MSB of $S3/S1^3$ (block 64, lines 4 and corresponding gates) can be eliminated. If, in the general case with m $\neq$ 4, $m_1(x)$ where chosen such that the LSB were always the same, the portion of multiplier 60 which calculates the LSB (block 61, line 1 and corresponding gates) could be eliminated, as well as the inverter 45 that adds 1 to the LSB position.

The two values B/S1 of the error-locator equation differ only by 1. Accordingly, the least significant bits of the corresponding contents of the ROM will be either a zero or a one, depending on whether $z^i/S1$ or $z^j/S1$ is stored there. Accordingly, this position (shown as column 56) may be eliminated and a 1 is instead hardwired as the LSB signal, the entire quantity arbitrarily denoted $z^i/S1$.

The zero-address location of ROM 60 and the leftmost output column 52 are used for the special case of a single-bit error. The address to the ROM is zero if and only if there exists a single-bit error in the received word R. By loading the zero-address location of the ROM with all zeroes, a B/S1 output of 0001 results (columns 53, 54, 55 carrying 0's, the 1 being hardwired). This generates $z^i$ and $z^j$ quantities which agree with the single bit error case: $z^i$=S1 and $z^j$=0. The left column of the ROm is used to identify a single-bit error. By loading a 0 in the zero-address location and a 1 in the leftmost positions of all other locations, that bit position in the output of the ROM indicates a "not-1 error" condition. This signal is sent through AND gate 58 in FIG. 3. Parity check signal $s_p$ from syndrome calculator 30 indicates an odd number of errors. The combination of these two signals identifies a triple-error condition. The signal from gate 58 therefore corresponds to identifying errors that are not correctable. A 1 on this line indicates the received word R cannot be corrected, so it is used to disable decoding networks 75 and 85 so that a miscorrection cannot take place. The Triple-Error Detect signal is available to other parts of the system.

Returning again to FIG. 3, multiplier 70 receives S1 from calculator 30 and the output of ROM 50. The bits stored in the ROM are sent over are $m-1$ lines 53, 54...55 (the MSB over line 53). A hardwired 1 is sent over line 57. Multiplier 70 multiplies these two quantities together yield $z^i$ (which can identify the first of the two error positions). Multiplier 70 is the same as multiplier 60 discussed above. Since the $z^i/S1$ input to multiplier 70 has a hardwired 1 in the LSB position, the portion of the multiplier implementing the LSB of $z^i$ can be simplified. Summer 80 is an XOR network which adds the corresponding bits S1 and $z^i$ to yield $z^j$ (which can identify the second error position). In the single-error case, $z^i/S1$=0...01, so $z^i$=S1. Therefore, for a single-bit error, S1 is added to S1 resulting in $z^i$=0.

$z^i$ and $z^j$ are fed into 1-of-($n-1$) decoding networks 75 and 85 respectively. (The parity bit is not corrected.) The decoding circuitry is based on decoding matrix H shown in FIG. 2A. $z^i$ and $z^j$ reside in the top half of the columns in the H matrix which correspond to the erroneous bit positions. For the (16,7) code, $n$=16 and a 1-of-15 decoder with 15 output lines (one for each bit of error words E1 and E2) is used. Error words E1 and E2 are all zero except for a single 1 in an erroneous bit positon. For a single bit error, $z^j$=0 which gives E2 equal to 0. Error words E1 and E2 are fed into summer 90 and added to received word R (the parity bit $p'$ is not included here) to generate a corrected word C (which does not include a parity bit and is therefore $n-1$ bits wide). The net effect is to toggle the two erroneous bits in the received word R as indicated by E1 and E2. The correct codeword C is produced at the output of the summer.

The direct decoder of the present invention can be used in a main memory environment by using an appropriate cycle time. A variable cycle time, in which correctly received words require a shorter EDAC time then erroneously received words may also be desirable.

An embodiment of the invention has been described in detail. It will be obvious to those skilled in the art that the invention may be otherwise embodied without departing from the spirit and scope of the present invention.

What is claimed is:

1. An apparatus for detecting and correcting double-bit errors in $n$-bit codewords, where said codewords include $k$ information bits, $2m$ check bits and one parity bit ($n=k+2m+1$), said apparatus comprising:
   means responsive to said codeword for calculating a first and a second syndrome, said syndromes identifying the existence and position of errors in said codeword according to an error-locator equation;
   translation means responsive to said syndromes for generating root signals corresponding to one of the roots of said error-locator equation;
   first multiplier means coupled to said translation means and to said calculation means for receiving said first syndrome and said root signals, said first multiplier means producing first signals for identifying a first error-location;
   first summing means coupled to said first multiplying means and to said calculation means for receiving said first signals and said first syndrome, said summing means producing second signals corresponding to a second error-location;
   first decoding means responsive to said first multiplying means for decoding said first signals and for producing an error word containing a 1 corresponding to said first error-location;
   second decoding means responsive to said first summing means for decoding said second signals and for producing a second error word containing a 1 corresponding to said second error-locaton; and
   second summing means adapted to receive said codeword and responsive to said first and said second decoding means, said second summing means adding said first and said second error words to said codeword for generating a corrected codeword.

2. The apparatus as defined in claim 1 further comprising:
   first non-zero detect logic responsive to said first syndrome for producing a signal when said first syndrome is equal to zero;
   second non-zero detect logic responsive to said second syndrome for generating a signal when said second syndrome is equal to zero;
   first gating means responsive to said first and said second non-zero detect logic for generating an error detect signal when either of said syndromes is not equal to zero; and second gating means responsive to said first and said second non-zero detect logic for generating a decoding failure signal when only one of said syndromes is equal to zero.

3. The apparatus as defined in claim 1 wherein said translation means comprises:
first means responsive to said first and said second syndromes for generating third signals corresponding to said second syndrome divided by the cube of said first syndrome; and
second means responsive to said first means for translating said third signals into said root signals.

4. The apparatus as defined in claim 3 wherein said second means further comprises means for generating a multiple error signal indicating the occurrence of more than one error.

5. The apparatus as defined in claim 4 wherein said calculation means also generates a parity checking signal indicating the occurrence of a parity error in said codeword and further comprising third gating means responsive to said multiple error signal and said parity checking signal for generating a triple error detect signal, said third gating means connected to said first and said second decoding means for disabling said first and said second decoding means.

6. The apparatus as defined in claim 3 wherein said second means comprises a table look-up mechanism, said third signals acting as an address to said table look-up mechanism, said root signals corresponding to the contents of the location indicated by said address.

7. The apparatus as claimed in claim 6 wherein said table look-up mechanism is a read only memory (ROM).

8. The apparatus as defined in claim 3 wherein said first means comprises:
translator means responsive to said first syndrome for generating fourth signals corresponding to said cubed inverse of said first syndrome; and
second multiplying means coupled to said translator means and to said calculation means for multiplying said second syndrome and said fourth signals as elements in a Galois field over a generator polynomial $g(x)$.

9. The apparatus as defined in claim 8 wherein said translator means comprises a table look-up mechanism.

10. The apparatus as defined in claim 9 wherein the table look-up mechanism is a read only memory (ROM).

* * * * *